(12) United States Patent
Jain et al.

(10) Patent No.: US 12,212,294 B2
(45) Date of Patent: Jan. 28, 2025

(54) LOW NOISE AMPLIFIERS WITH GAIN STEPS PROVIDED BY BYPASS STAGE AND CURRENT STEERING

(71) Applicant: Skyworks Solutions, Inc., Irvine, CA (US)

(72) Inventors: Sanjeev Jain, Kanata (CA); Haoran Yu, Ottawa (CA); Nan Sen Lin, Kanata (CA); Hassan Sarbishaei, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 319 days.

(21) Appl. No.: 17/815,687

(22) Filed: Jul. 28, 2022

(65) Prior Publication Data

US 2023/0095653 A1 Mar. 30, 2023

Related U.S. Application Data

(60) Provisional application No. 63/261,597, filed on Sep. 24, 2021.

(51) Int. Cl.
*H04B 1/16* (2006.01)
*H03F 3/45* (2006.01)

(52) U.S. Cl.
CPC .......... *H03F 3/45475* (2013.01); *H04B 1/16* (2013.01); *H03F 2200/06* (2013.01); *H03F 2200/294* (2013.01); *H03F 2200/451* (2013.01)

(58) Field of Classification Search
CPC ............. H03F 3/45475; H03F 2200/06; H03F 2200/294; H03F 2200/451; H04B 1/16

USPC ......................................................... 455/341
See application file for complete search history.

(56) References Cited

U.S. PATENT DOCUMENTS

| | | | |
|---|---|---|---|
| 5,047,728 A | 9/1991 | Bayruns |
| 5,724,657 A | 3/1998 | Lin et al. |
| 5,761,250 A | 6/1998 | Lin |
| 6,134,427 A | 10/2000 | Hughes |
| 6,445,251 B1 | 9/2002 | Robinson |
| 6,498,926 B1 | 12/2002 | Ciccarelli et al. |
| 6,744,322 B1 | 6/2004 | Ma et al. |
| 6,804,359 B1 | 10/2004 | Yu et al. |
| 7,808,342 B2 | 10/2010 | Prikhodko et al. |

(Continued)

OTHER PUBLICATIONS

Adabi et al., "30 GHz CMOS low noise amplifier", in Proc. IEEE Radio Freq. Integr. Circuits (RFIC) Symp., pp. 625-628 (Jun. 2007).

(Continued)

*Primary Examiner* — April G Gonzales
(74) *Attorney, Agent, or Firm* — Knobbe, Martens, Olson & Bear, LLP

(57) ABSTRACT

Low noise amplifiers (LNAs) are disclosed herein. In certain embodiments, an LNA includes an input balun configured to convert a single-ended radio frequency (RF) receive signal to a differential RF receive signal, an amplifier chain configured to amplify the differential RF receive signal to generate a differential amplified RF receive signal, and an output balun configured to convert the differential amplified RF receive signal into a single-ended amplified RF receive signal. The LNA's amplifier chain is operable in multiple gain modes, and includes a first differential amplification stage, a second differential amplification stage, and a third differential amplification stage.

20 Claims, 14 Drawing Sheets

(56) References Cited

U.S. PATENT DOCUMENTS

| | | | |
|---|---|---|---|
| 7,839,234 B2 | 11/2010 | Prikhodko et al. | |
| 7,898,469 B2 * | 3/2011 | Ujita | H03D 7/165 |
| | | | 342/134 |
| 8,140,025 B2 | 3/2012 | Gorbachov | |
| 8,319,562 B2 | 11/2012 | Sun et al. | |
| 8,644,773 B2 | 2/2014 | Cebi | |
| 8,704,597 B2 | 4/2014 | Yu et al. | |
| 8,717,100 B2 | 5/2014 | Reisner et al. | |
| 8,797,104 B2 | 8/2014 | Hsieh et al. | |
| 8,970,296 B1 | 3/2015 | Pratt | |
| 9,054,663 B2 | 6/2015 | Reisner et al. | |
| 9,252,077 B2 | 2/2016 | Molzer et al. | |
| 9,305,859 B2 | 4/2016 | Williams et al. | |
| 9,407,215 B2 | 8/2016 | Gill | |
| 9,478,977 B2 | 10/2016 | Li et al. | |
| 9,503,025 B2 | 11/2016 | Cao et al. | |
| 9,602,064 B2 | 3/2017 | Wu et al. | |
| 9,667,206 B2 * | 5/2017 | Anderson | H03F 3/213 |
| 9,674,006 B2 | 6/2017 | Zhu et al. | |
| 9,692,473 B2 * | 6/2017 | Gard | H04B 1/18 |
| 9,698,740 B2 | 7/2017 | Lin et al. | |
| 9,721,936 B2 | 8/2017 | Zhu et al. | |
| 9,735,737 B2 | 8/2017 | Gorbachov et al. | |
| 9,741,653 B2 | 8/2017 | Roy et al. | |
| 9,813,029 B2 | 11/2017 | Zhu et al. | |
| 9,831,841 B2 | 11/2017 | Wu et al. | |
| 9,852,978 B2 | 12/2017 | Roy et al. | |
| 9,893,682 B2 | 2/2018 | Zhu et al. | |
| 9,973,148 B2 | 5/2018 | Zhu et al. | |
| 9,991,885 B2 | 6/2018 | Zhu et al. | |
| 10,050,002 B2 | 8/2018 | Roy et al. | |
| 10,063,200 B2 | 8/2018 | Wu et al. | |
| 10,084,416 B2 | 9/2018 | Wallis | |
| 10,103,693 B2 | 10/2018 | Zhu et al. | |
| 10,122,333 B2 * | 11/2018 | Roberg | H03F 3/21 |
| 10,135,408 B2 | 11/2018 | Cao et al. | |
| 10,147,990 B2 | 12/2018 | Cebi | |
| 10,164,582 B2 | 12/2018 | Zhu et al. | |
| 10,171,045 B2 | 1/2019 | Pehlivanoglu | |
| 10,320,350 B1 | 6/2019 | Leitner et al. | |
| 10,574,287 B1 | 2/2020 | Thoppay Egambaram et al. | |
| 11,595,008 B2 | 2/2023 | Jain et al. | |
| 11,817,829 B2 | 11/2023 | Padyana et al. | |
| 11,923,808 B2 | 3/2024 | Jain et al. | |
| 2007/0066256 A1 | 3/2007 | Lee | |
| 2012/0202445 A1 | 8/2012 | Manetakis | |
| 2013/0057343 A1 * | 3/2013 | Kondo | H03F 1/0277 |
| | | | 330/252 |
| 2016/0142085 A1 * | 5/2016 | Choksi | H04B 1/1027 |
| | | | 375/340 |
| 2016/0192295 A1 | 6/2016 | Son et al. | |
| 2017/0005624 A1 | 1/2017 | Zhu et al. | |
| 2017/0005626 A1 | 1/2017 | Zhu et al. | |
| 2017/0040792 A1 | 2/2017 | Li et al. | |
| 2017/0162705 A1 | 6/2017 | Gorbachov et al. | |
| 2017/0163226 A1 | 6/2017 | Gorbachov et al. | |
| 2017/0300076 A1 | 10/2017 | Liang et al. | |
| 2017/0301630 A1 | 10/2017 | Nguyen et al. | |
| 2017/0301985 A1 | 10/2017 | Nguyen et al. | |
| 2017/0301986 A1 | 10/2017 | Nguyen et al. | |
| 2017/0310284 A1 | 10/2017 | Altunkilic et al. | |
| 2017/0317648 A1 | 11/2017 | Gorbachov et al. | |
| 2018/0026592 A1 | 1/2018 | Wallis | |
| 2018/0041204 A1 | 2/2018 | Zhu et al. | |
| 2018/0047715 A1 | 2/2018 | Zhu et al. | |
| 2018/0048345 A1 | 2/2018 | Pehlke et al. | |
| 2018/0054166 A1 | 2/2018 | Pehlivanoglu | |
| 2018/0062582 A1 | 3/2018 | Pehlivanoglu | |
| 2018/0062599 A1 | 3/2018 | Lee et al. | |
| 2018/0069511 A1 | 3/2018 | Zhu et al. | |
| 2018/0076774 A1 | 3/2018 | Pehlke et al. | |
| 2018/0138990 A1 | 5/2018 | Bergsma et al. | |
| 2018/0145648 A1 | 5/2018 | Ye et al. | |
| 2018/0175797 A1 | 6/2018 | Lee et al. | |
| 2018/0175814 A1 | 6/2018 | Wu et al. | |
| 2018/0183431 A1 | 6/2018 | Zhu et al. | |
| 2018/0226367 A1 | 8/2018 | Babcock et al. | |
| 2018/0261566 A1 | 9/2018 | Babcock et al. | |
| 2018/0323778 A1 | 11/2018 | Zhu et al. | |
| 2018/0324967 A1 | 11/2018 | Mcgehee et al. | |
| 2018/0331657 A1 | 11/2018 | Zhu et al. | |
| 2018/0337670 A1 | 11/2018 | Zhu et al. | |
| 2019/0007002 A1 | 1/2019 | Wallis | |
| 2019/0058446 A1 | 2/2019 | Zhu et al. | |
| 2019/0074813 A1 | 3/2019 | Zou et al. | |
| 2019/0097591 A1 | 3/2019 | Pehlivanoglu | |
| 2019/0139923 A1 | 5/2019 | Roy et al. | |
| 2019/0149102 A1 | 5/2019 | Altunkilic et al. | |
| 2019/0158028 A1 | 5/2019 | Pehlivanoglu | |
| 2019/0181815 A1 | 6/2019 | Wallis | |
| 2019/0190461 A1 | 6/2019 | Zhu et al. | |
| 2019/0190462 A1 | 6/2019 | Zhu et al. | |
| 2019/0190623 A1 | 6/2019 | Bergsma et al. | |
| 2019/0198990 A1 | 6/2019 | Nguyen et al. | |
| 2019/0199344 A1 | 6/2019 | Zhu et al. | |
| 2019/0214354 A1 | 7/2019 | Soliman et al. | |
| 2019/0229679 A1 | 7/2019 | Gorbachov et al. | |
| 2019/0252875 A1 | 8/2019 | Li et al. | |
| 2019/0273076 A1 | 9/2019 | Zhu et al. | |
| 2019/0273475 A1 | 9/2019 | Ye et al. | |
| 2019/0273478 A1 | 9/2019 | Lin et al. | |
| 2019/0273480 A1 | 9/2019 | Lin et al. | |
| 2019/0341687 A1 | 11/2019 | Nguyen et al. | |
| 2020/0014381 A1 | 1/2020 | Zhu et al. | |
| 2020/0052657 A1 | 2/2020 | Zhu et al. | |
| 2020/0052660 A1 | 2/2020 | Cao et al. | |
| 2020/0119741 A1 | 4/2020 | Jain et al. | |
| 2020/0119742 A1 | 4/2020 | Jain et al. | |
| 2020/0154434 A1 | 5/2020 | Balteanu | |
| 2020/0169285 A1 | 5/2020 | Arfaei Malekzadeh et al. | |
| 2020/0227372 A1 | 7/2020 | Roy et al. | |
| 2020/0266777 A1 | 8/2020 | Arfaei Malekzadeh et al. | |
| 2020/0272182 A1 | 8/2020 | Liang et al. | |
| 2020/0279825 A1 | 9/2020 | Babcock et al. | |
| 2020/0336122 A1 | 10/2020 | Lin et al. | |
| 2020/0357756 A1 | 11/2020 | Wallis | |
| 2020/0366256 A1 | 11/2020 | Pehlivanoglu | |
| 2020/0389166 A1 | 12/2020 | Zhu et al. | |
| 2021/0218373 A1 | 7/2021 | Jain et al. | |
| 2021/0234518 A1 | 7/2021 | Luo | |
| 2022/0247364 A1 * | 8/2022 | Padyana | H03F 1/56 |
| 2023/0163728 A1 | 5/2023 | Jain et al. | |
| 2024/0097623 A1 | 3/2024 | Padyana et al. | |
| 2024/0171128 A1 | 5/2024 | Jain et al. | |

OTHER PUBLICATIONS

Bhattacharya et al., "A 28GHZ, 7mW, 32dB gain and 3.3dB NF, gmboosted CG-CS LNA for 5G RF beamformers", pp. 62-64, 2019 12th Global Symposium on Millimeter Waves (GSMM).

Dang et al., "A K-band High Gain, Low Noise Figure LNA using 0.13 m Logic CMOS Technology ", in 10th European Microwave Integrated Circuits Conference 2015.

Elkholy et al., "A wideband variable gain LNA with high OIP3 for 5G using 40-nm bulk Cmos", IEEE Microw. Wireless Compon. Lett., vol. 28(1):64-66 (Jan. 2018).

Guo et al., "A transformer feedback Gm-boosting technique for gain improvement and noise reduction in mm-Wave cascode LNAs", IEEE Trans. Microw. Theory Techn., vol. 64(7):2080-2090 (Jul. 2016).

Hedayati et al., "A 33-GHz LNA for 5G Wireless Systems in 28-nm Bulk CMOS", in IEEE Transactions on Circuits and Systems II: Express Brief vol. 65(10), Oct. 2018.

Huang, "A Ka-band CMOS low-noise amplifier for Ka-band communication system", In Proceedings of the World Congress on Engineering and Computer Science, vol. 2 (2010).

Kolios et al., "Transformer & Marchand Integrated Baluns of Extremely Small Size for 60 GHz Applications in 65nm CMOS Technology", in 2016 21st International Conference on Microwave, Radar and Wireless Communications (MIKON).

Lee et al., "A Ka-Band Phase-Compensated Variable-Gain CMOS Low-Noise Amplifier," in IEEE Microwave and Wireless Components Letters, Feb. 2019.

(56) References Cited

OTHER PUBLICATIONS

Onoe, "Evolution of 5G mobile technology toward 1 2020 and beyond, " in 2016 IEEE Int. Solid-State Circuits Conf. (ISSCC), pp. 23-28 (2016).
Qin et al., "Compact wideband LNA with gain and input matching bandwidth extensions by transformer", IEEE Microwave and Wireless Components Letters, vol. 27(7):657-659 (Jul. 2017).
Sanduleanu et al., "31-34GHz low noise amplifier with on-chip microstrip lines and inter-stage matching in 90-nm baseline CMOS, " in IEEE Radio Frequency Integrated Circuits (RFIC) Symp., 2006.

* cited by examiner

LOW NOISE AMPLIFIERS WITH GAIN STEPS PROVIDED BY BYPASS STAGE AND CURRENT STEERING

CROSS-REFERENCE TO RELATED APPLICATIONS

This application claims the benefit of priority under 35 U.S.C. § 119 of U.S. Provisional Patent Application No. 63/261,597, filed Sep. 24, 2021 and titled "LOW NOISE AMPLIFIERS WITH GAIN STEPS PROVIDED BY BYPASS STAGE AND CURRENT STEERING," which is herein incorporated by reference in its entirety.

BACKGROUND

Technical Field

Embodiments of the invention relate to electronic systems, and in particular, to radio frequency (RF) electronics.

Description of Related Technology

A low noise amplifier (LNA) can be used to boost the amplitude of a relatively weak radio frequency (RF) signal received via an antenna. Thereafter, the boosted RF signal can be used for a variety of purposes, including, for example, driving a switch, a mixer, and/or a filter in an RF communication system.

Examples of RF communication systems with one or more LNAs include, but are not limited to, mobile phones, tablets, base stations, network access points, customer-premises equipment (CPE), laptops, and wearable electronics.

LNAs can be included in RF communication systems to amplify signals of a wide range of frequencies. For example, an LNA can be used to provide low noise amplification to RF signals in a frequency range of about 30 kHz to 300 GHz, such as in the range of about such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a low noise amplifier. The low noise amplifier a radio frequency input terminal configured to receive a single-ended radio frequency receive signal from an antenna, an input balun configured to convert the single-ended radio frequency receive signal to a differential radio frequency receive signal, and an amplifier chain configured to amplify the differential radio frequency receive signal to generate a differential amplified radio frequency receive signal. The amplifier chain including a first differential amplification stage, a second differential amplification stage, and a third differential amplification stage, the amplifier chain operable in a plurality of power modes including a first power mode in which the first differential amplification stage, the second differential amplification stage, and the third differential amplification stage operate in series to amplify the differential radio frequency receive signal, and a second power mode in which the second differential amplification stage is bypassed.

In various embodiments, the low noise amplifier further includes an output balun configured to convert the differential amplified radio frequency receive signal into a single-ended amplified radio frequency receive signal.

In some embodiments, the plurality of power modes further includes a third power mode in which the second differential amplification stage is bypassed and in which a gain of the first differential amplification stage and a gain of the second differential amplification stage is adjusted. According to a number of embodiments, the first power mode is a high power mode, the second power mode is a mid power mode, and the third power mode is a low power mode. In accordance with several embodiments, the gain of the first differential amplification stage is adjusted in the third power mode by current steering.

In various embodiments, the first differential amplification stage includes a gain transistor, a cascode transistor in series with the gain transistor, and a current steering transistor in parallel with the cascode transistor. According to a number of embodiments, the gain transistor is biased by a first current, and a proportion of the first current that flows through the cascode transistor relative to the current steering transistor is adjustable to provide gain control.

In several embodiments, the amplifier chain includes a first bypass switch network configured in the first gain mode to connect a first output of the first differential amplification stage to a first input of the second differential amplification stage and to connect a first output of the second differential amplification stage to a first input of the third differential amplification stage, the first bypass switch network further configured in the second gain mode to connect the first output of the first differential amplification stage to the first input of the third differential amplification stage. In accordance with various embodiments, the first bypass switch network includes a first series switch and a second series switch connected between the first output of the first differential amplification stage to the first input of the third differential amplification stage and to one another at an intermediate node, and a first shunt switch connected between the intermediate node and ground.

In some embodiments, the amplifier chain further includes a fine attenuator and a coarse attenuator coupled to a differential input to the third differential amplification stage.

In certain embodiments, the present disclosure relates a mobile device. The mobile device includes an antenna, and a front-end system including a low noise amplifier having an input terminal configured to receive a single-ended radio frequency receive signal from the antenna. The low noise amplifier includes an input balun configured to convert the single-ended radio frequency receive signal to a differential radio frequency receive signal, and an amplifier chain configured to amplify the differential radio frequency receive signal to generate a differential amplified radio frequency receive signal. The amplifier chain includes a first differential amplification stage, a second differential amplification stage, and a third differential amplification stage, the low noise amplifier operable in a plurality of power modes including a first power mode in which the first differential amplification stage, the second differential amplification stage, and the third differential amplification stage operate in series to amplify the differential radio frequency receive signal, and a second power mode in which the second differential amplification stage is bypassed.

In some embodiments, the low noise amplifier further includes an output balun configured to convert the differential amplified radio frequency receive signal into a single-ended amplified radio frequency receive signal.

In several embodiments, the plurality of power modes further includes a third power mode in which the second differential amplification stage is bypassed and in which a gain of the first differential amplification stage and a gain of the second differential amplification stage is adjusted.

In various embodiments, the first power mode is a high power mode, the second power mode is a mid power mode, and the third power mode is a low power mode.

In some embodiments, the gain of the first differential amplification stage is adjusted in the third power mode by current steering.

In several embodiments, the first differential amplification stage includes a gain transistor, a cascode transistor in series with the gain transistor, and a current steering transistor in parallel with the cascode transistor. According to a number of embodiments, the gain transistor is biased by a first current, and a proportion of the first current that flows through the cascode transistor relative to the current steering transistor is adjustable to provide gain control.

In some embodiments, the amplifier chain includes a first bypass switch network configured in the first gain mode to connect a first output of the first differential amplification stage to a first input of the second differential amplification stage and to connect a first output of the second differential amplification stage to a first input of the third differential amplification stage, the first bypass switch network further configured in the second gain mode to connect the first output of the first differential amplification stage to the first input of the third differential amplification stage. In accordance with several embodiments, the first bypass switch network includes a first series switch and a second series switch connected between the first output of the first differential amplification stage to the first input of the third differential amplification stage and to one another at an intermediate node, and a first shunt switch connected between the intermediate node and ground.

In several embodiments, the amplifier chain further includes a fine attenuator and a coarse attenuator coupled to a differential input to the third differential amplification stage.

In various embodiments, a noise figure of the low noise amplifier is substantially equal in the first gain mode and the second gain mode.

In certain embodiments, the present disclosure a packaged module includes a package substrate, and a low noise amplifier die attached to the package substrate. The low noise amplifier die includes an input balun configured to convert a single-ended radio frequency receive signal to a differential radio frequency receive signal, and an amplifier chain configured to amplify the differential radio frequency receive signal to generate a differential amplified radio frequency receive signal. The amplifier chain includes a first differential amplification stage, a second differential amplification stage, and a third differential amplification stage, the low noise amplifier operable in a plurality of power modes including a first power mode in which the first differential amplification stage, the second differential amplification stage, and the third differential amplification stage operate in series to amplify the differential radio frequency receive signal, and a second power mode in which the second differential amplification stage is bypassed.

In certain embodiments, the present disclosure relates to a method of low noise amplification. The method includes converting a single-ended radio frequency receive signal to a differential radio frequency receive signal using an input balun of a low noise amplifier, amplifying the differential radio frequency receive signal to generate a differential amplified radio frequency receive signal using an amplifier chain of a low noise amplifier, operating the amplifier chain in a first gain mode in which a first differential amplification stage, a second differential amplification stage, and a third differential amplification stage of the amplifier chain operate in series with one another to amplify the differential radio frequency receive signal, and operating the amplifier chain in a second gain mode in which the second differential amplification stage is bypassed.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
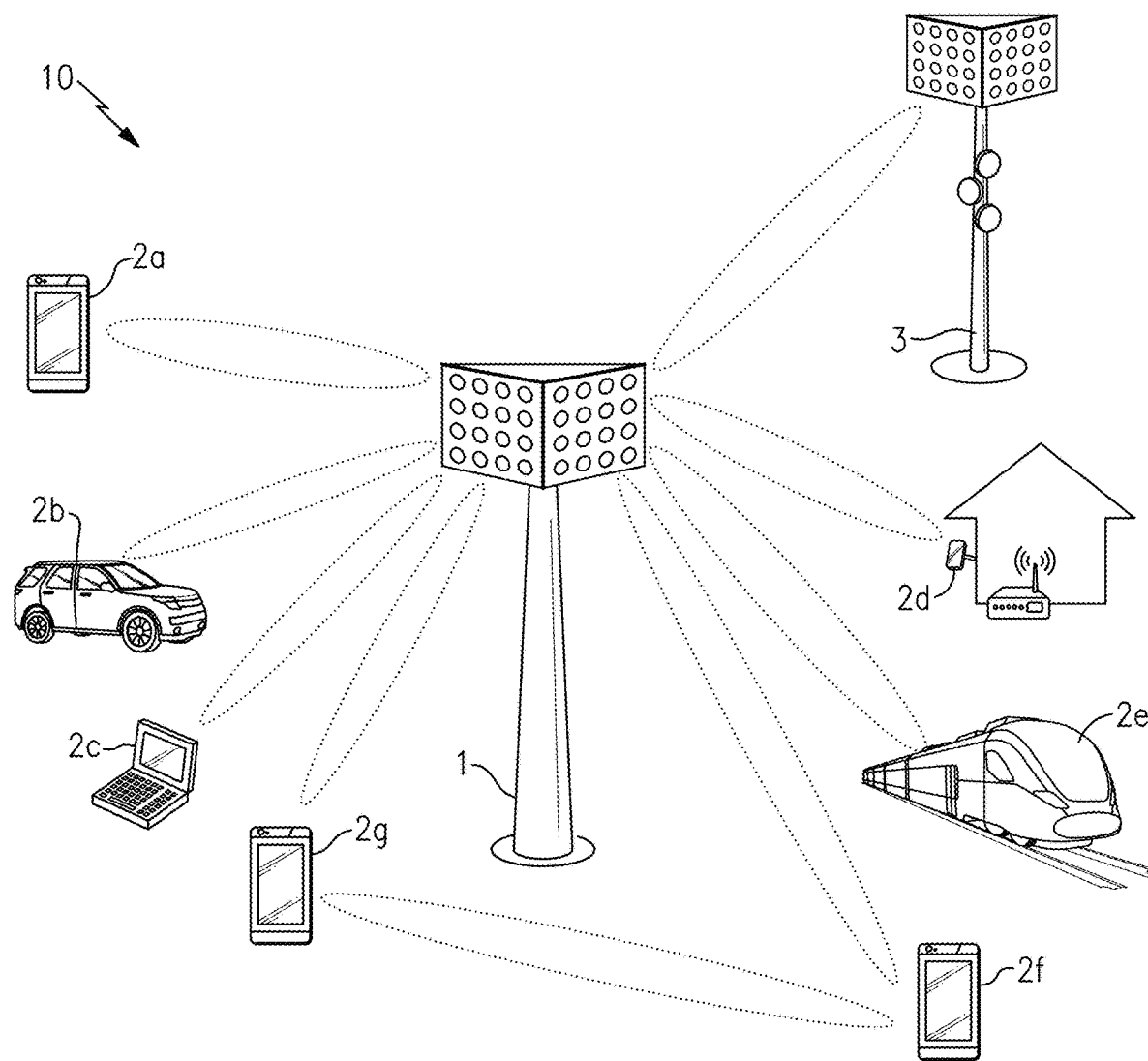
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
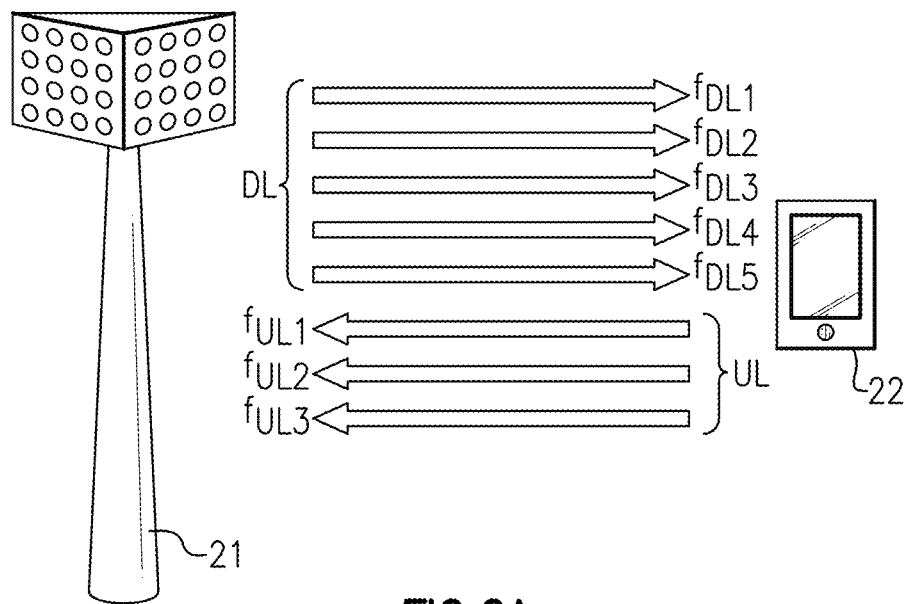
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
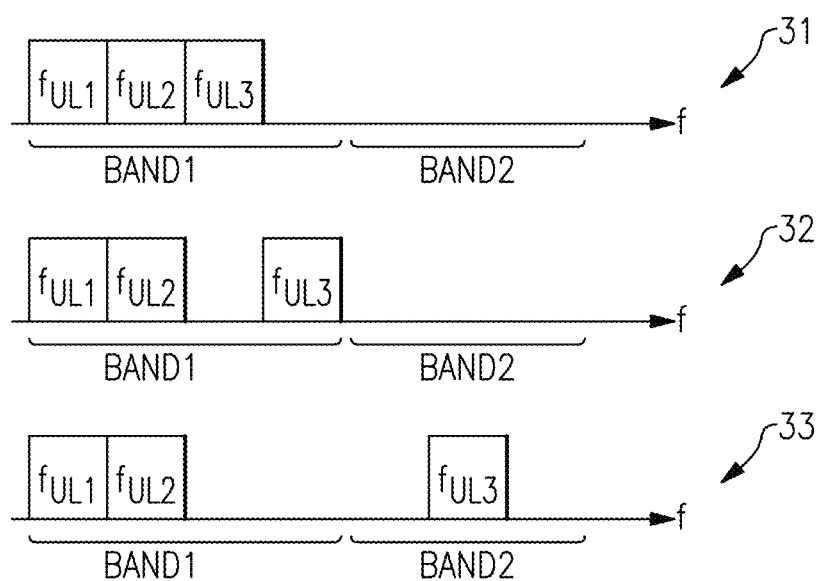
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
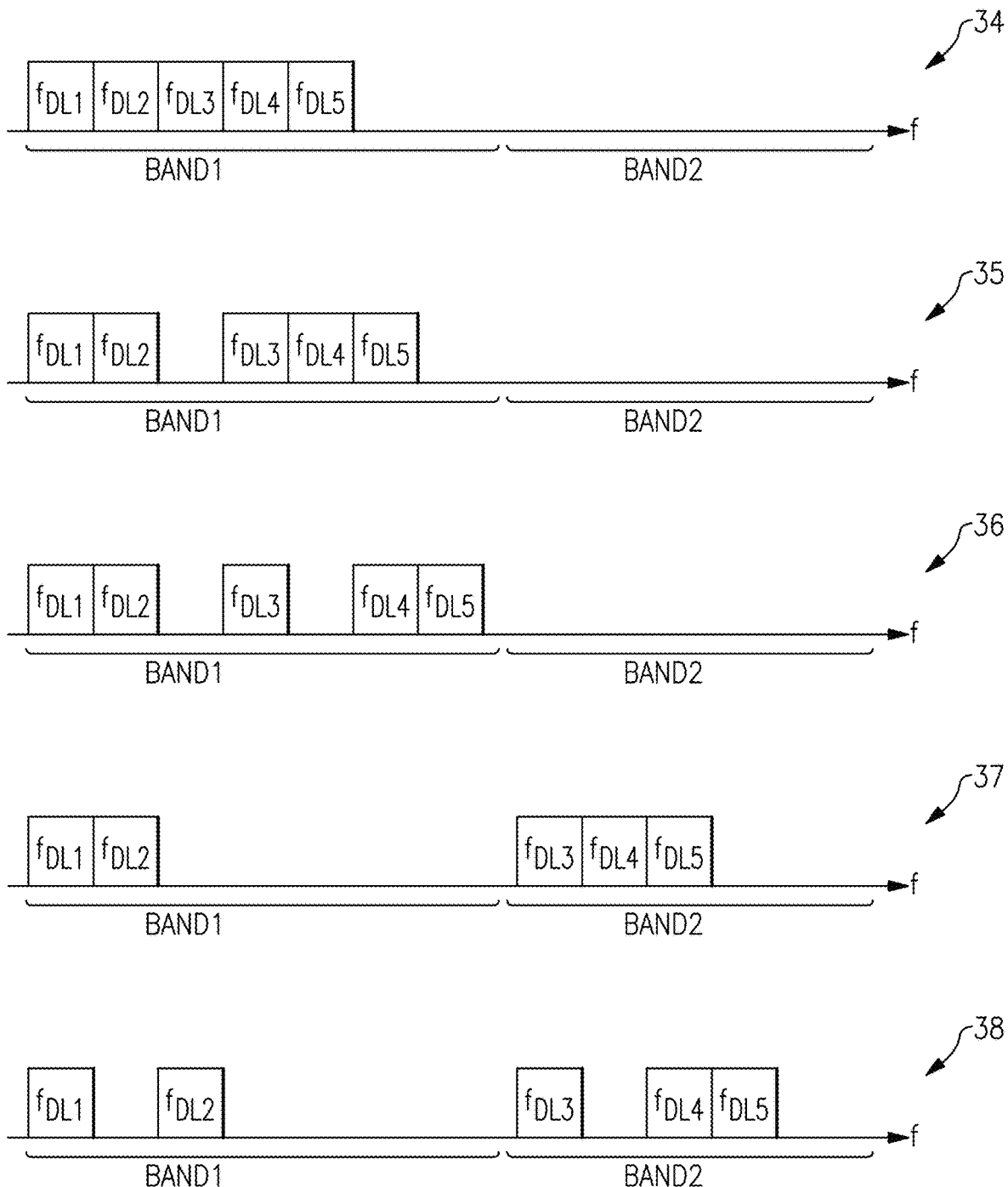
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
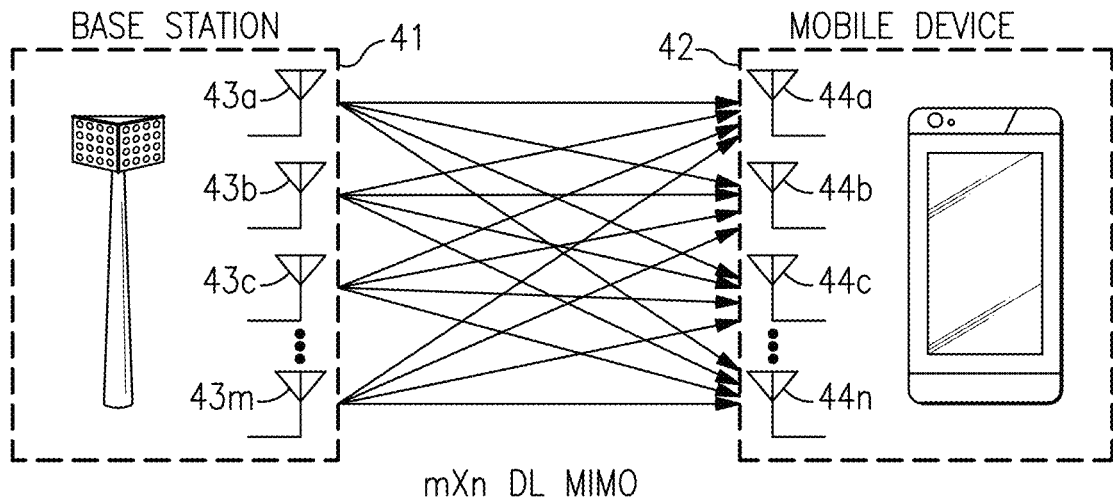
FIG. 3A is a schematic diagram of one example of a downlink channel using multi-input and multi-output (MIMO) communications.
Figure 3B:
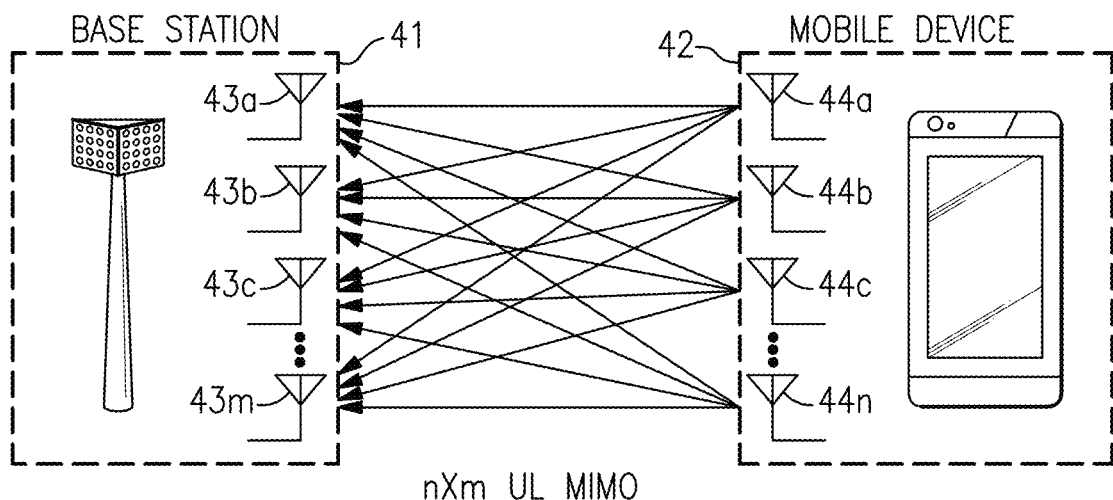
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
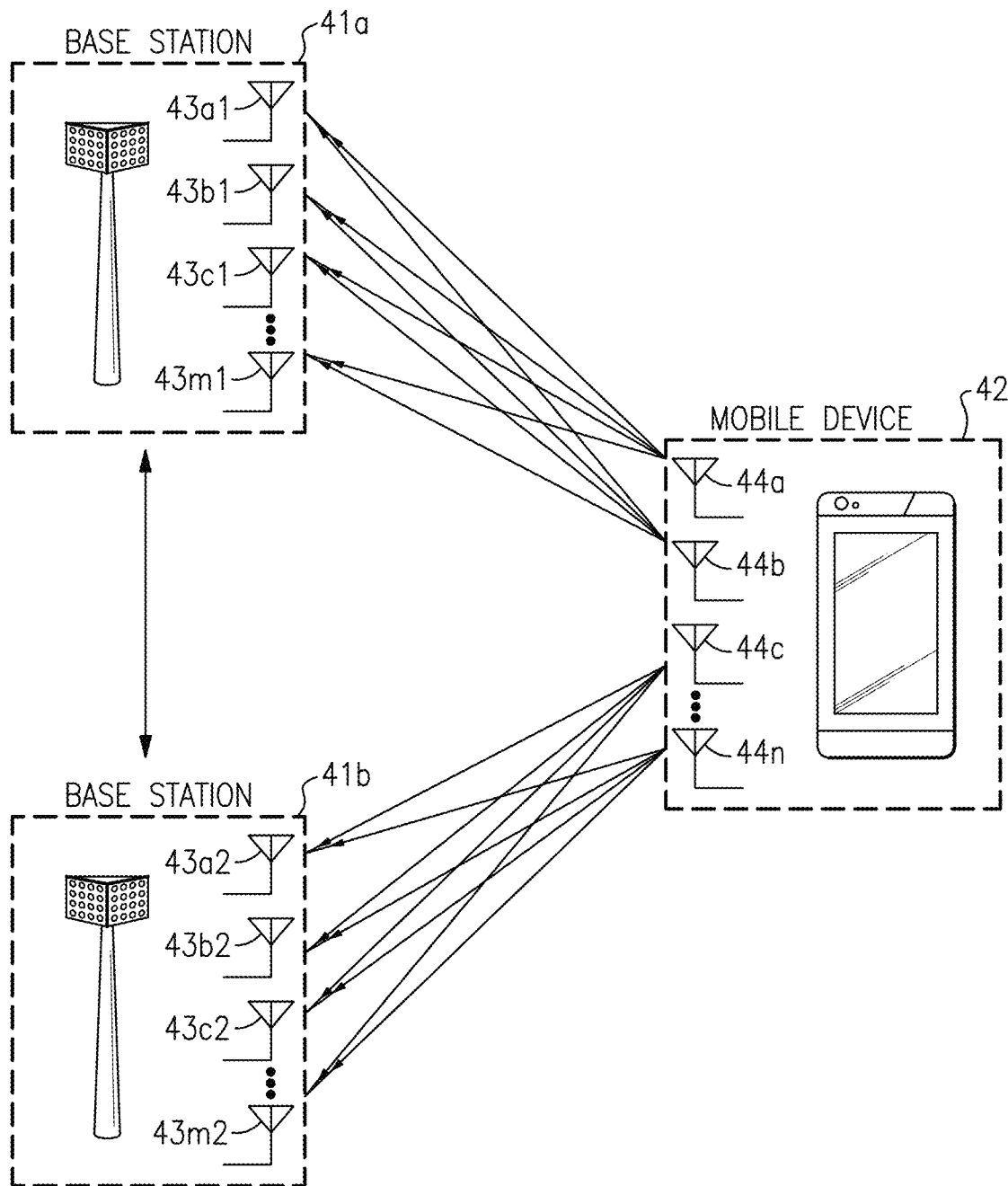
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

Figure 4A:
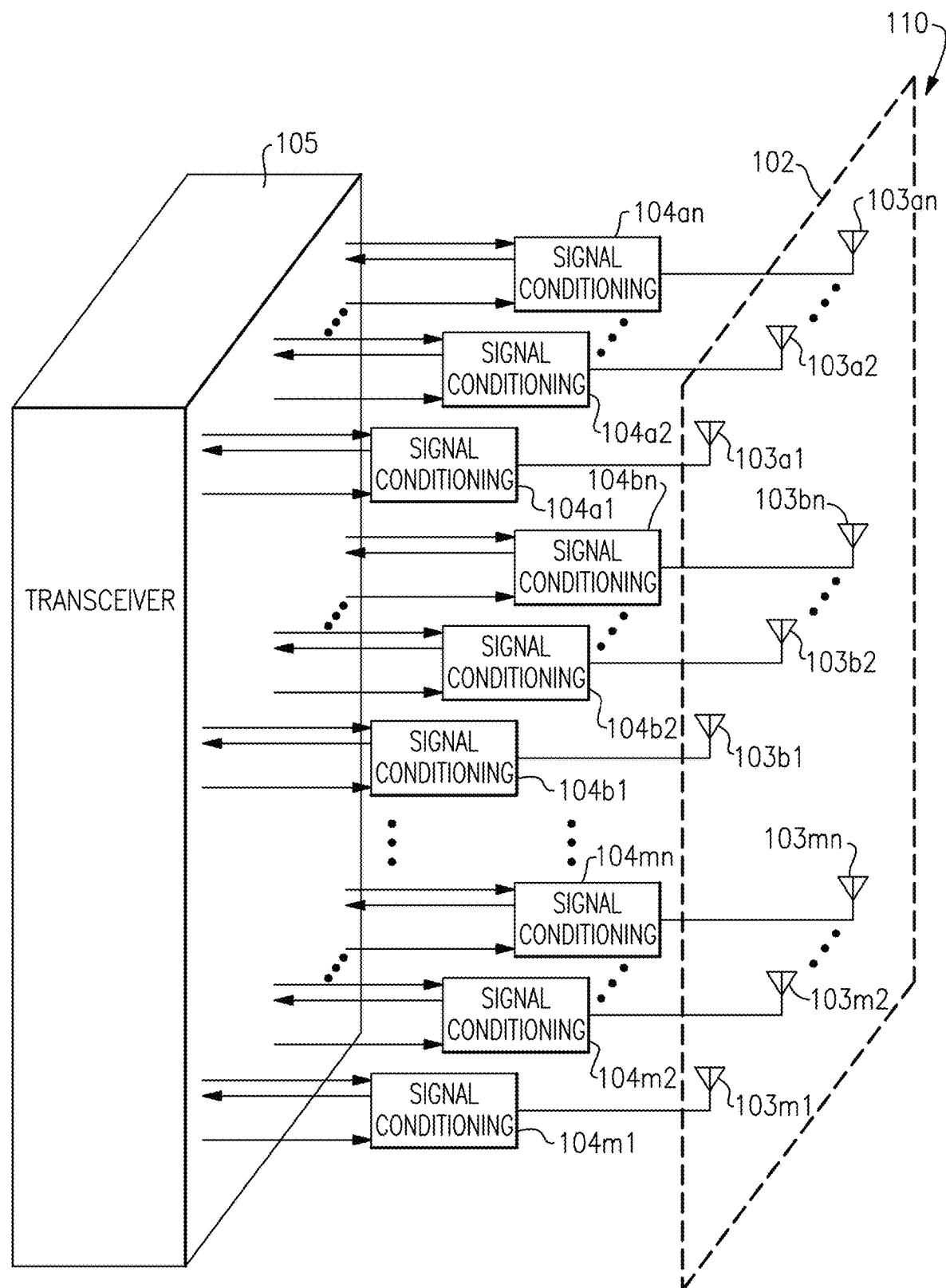
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
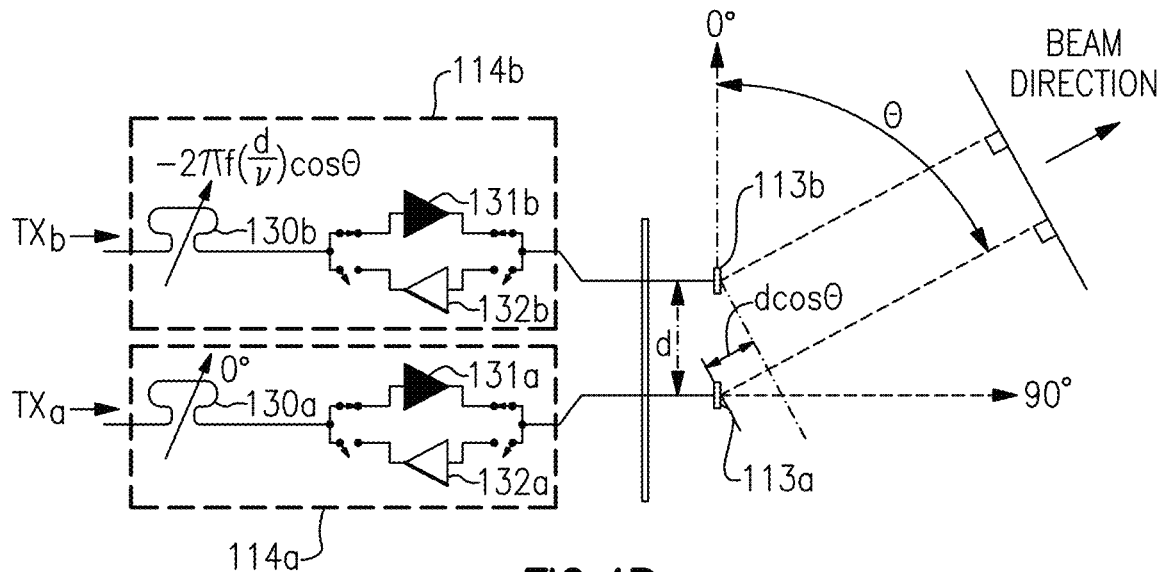
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 4B has been annotated with an angle $\ominus$, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle $\ominus$ can be achieved. For example, when the first phase shifter 130a has a reference value of 0°, the second phase shifter 130b can be controlled to provide a phase shift of about $-2\pi f(d/v)\cos\ominus$ radians, where f is the fundamental frequency of the transmit signal, d is the distance between the antenna elements, v is the velocity of the radiated wave, and $\pi$ is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi\cos\ominus$ radians to achieve a transmit beam angle $\ominus$.

Accordingly, the relative phase of the phase shifters 130a, 130b can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
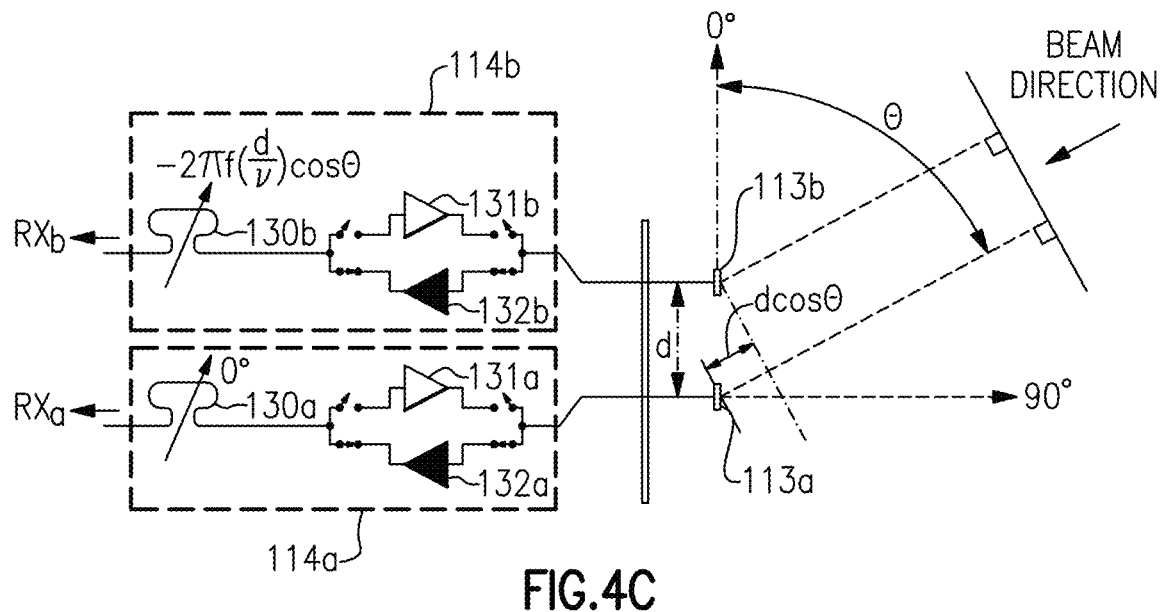
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130a and the second phase shifter 130b can be selected to about equal to $-2\pi f(d/v)\cos\Theta$ radians to achieve a desired receive beam angle $\Theta$. In implementations in which the distance d corresponds to about $½\lambda$, the phase difference can be selected to about equal to $-\pi\cos\Theta$ radians to achieve a receive beam angle $\Theta$.

Although various equations for phase values to provide beamforming have been provided, other phase selection values are possible, such as phase values selected based on implementation of an antenna array, implementation of signal conditioning circuits, and/or a radio environment.

Examples of LNAs with Gain Steps Provided by Bypass Stage and Current Steering

A low noise amplifier (LNA) is the first active circuit in a receiver chain. The position of LNA renders it as one of the most important components of a receiver. However, LNA designs are compromised by relatively low gain and relatively high noise figure (NF) due to parasitic capacitances and Miller effect. Consequently, in the design of an LNA, decisive trade-offs must be made between parameters such as gain, NF, linearity, and/or power.

LNAs are disclosed herein. In certain embodiments, an LNA includes an input balun configured to convert a single-ended RF receive signal to a differential RF receive signal, an amplifier chain configured to amplify the differential RF receive signal to generate a differential amplified RF receive signal, and an output balun configured to convert the differential amplified RF receive signal into a single-ended amplified RF receive signal. The LNA's amplifier chain is operable in multiple gain modes, and includes a first differential amplification stage, a second differential amplification stage, and a third differential amplification stage.

In a first gain mode, the first differential amplification stage, the second differential amplification stage, and the third differential amplification stage are connected in cascade to amplify the differential RF receive signal. Additionally, in a second gain mode, the second amplification stage is bypassed such that the first differential amplification stage and the third differential amplification stage are in cascade to amplify the differential RF receive signal. In certain implementations, the LNA further includes a third gain mode in which the second differential amplification stage is bypassed and current steering is used in the first differential amplification stage and/or the third differential amplification stage for gain control.

By implementing the LNA in this manner, low noise figure and good output linearity are achieved. Moreover, the noise figure and/or output linearity can be maintained substantially constant across at least the first gain mode and the second gain mode, thereby achieving robust performance for multiple gain steps (for example, for high gain and mid gain steps). Furthermore, the bypass can achieve well-defined gain drop with little to no impact on port impedances for each stage. Additionally, further gain tuning mechanisms, such as the inclusion of an attenuator in the amplifier chain can provide additional gain control to achieve further gain steps.

Figure 5A:
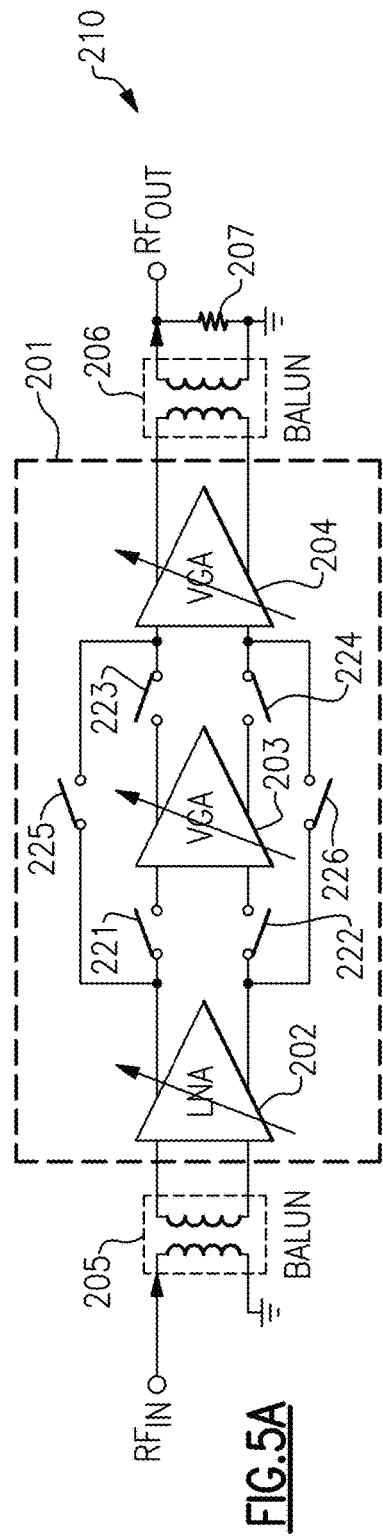
FIG. 5A is a schematic diagram of one embodiment of a low noise amplifier (LNA).
Figure 5B:
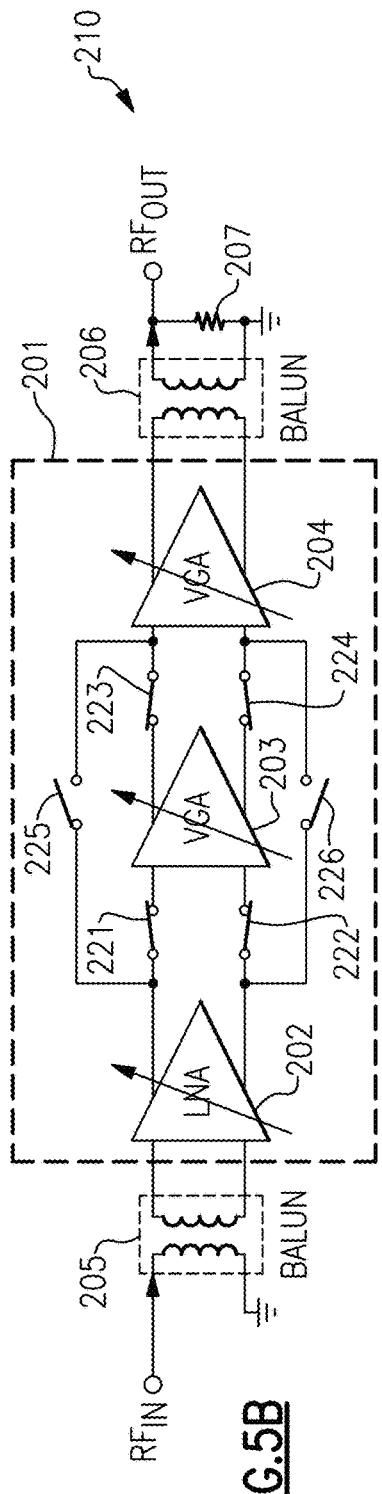
FIG. 5B depicts a first gain mode of the LNA of FIG. 5A.
Figure 5C:
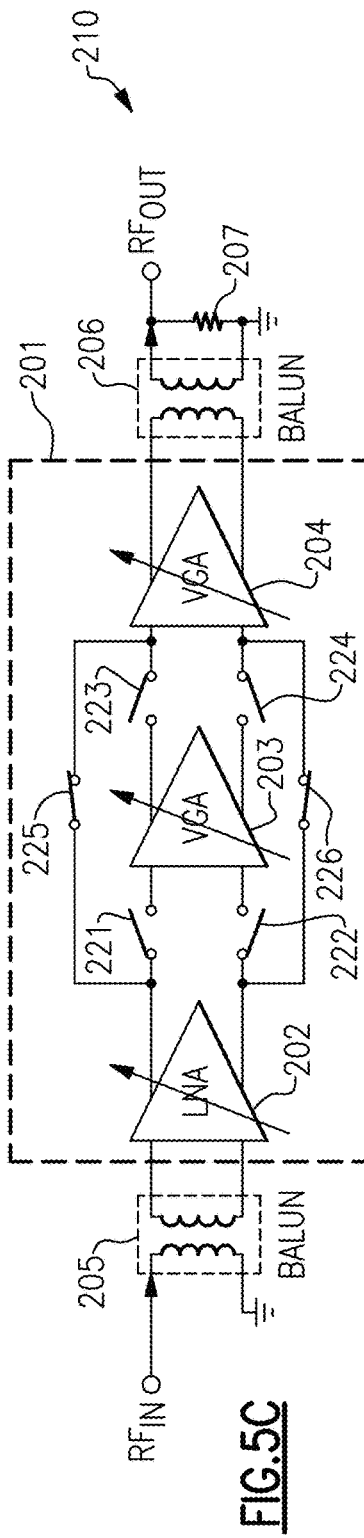
FIG. 5C depicts a second gain mode of the LNA of FIG. 5A.

FIG. 5A is a schematic diagram of one embodiment of an LNA 210. FIG. 5B depicts a first gain mode of the LNA 210 of FIG. 5A. FIG. 5C depicts a second gain mode of the LNA 210 of FIG. 5A.

The LNA 210 includes an input terminal $RF_{IN}$ (single-ended, in this embodiment), an input balun 205, an output balun 206, and an output terminal $RF_{OUT}$ connected to a load 207. The LNA 210 further includes an amplifier chain 201 (also referred to herein as an LNA chain or LNA amplification circuitry) including a first differential LNA stage 202, a second differential LNA stage 203, a third differential LNA stage 204, and first to sixth bypass switches 221-226, respectively.

The input terminal $RF_{IN}$ receives a single-ended RF receive signal from an antenna (not shown in FIG. 5A). In certain implementations, the single-ended RF receive signal has a frequency of 20 GHz or more. The LNA 210 is depicted as driving the resistive load 207. However, the LNA 210 can drive any suitable load impedance.

In the illustrated embodiment, the input balun 205 converts the single-ended RF receive signal into a differential RF receive signal. Additionally, the amplifier chain 201 amplifies the differential RF receive signal to generate a differential amplified RF receive signal, which is provided to the output balun 206. The output balun 206 converts the differential amplified RF receive signal to a single-ended amplified RF signal provided to the output terminal $RF_{OUT}$.

The amplifier chain 201 is controllable to operate the LNA 210 in multiple gain modes.

For example, a first gain mode is shown in FIG. 5B. In the first gain mode, the first bypass switch 221, the second bypass switch 222, the third bypass switch 223, and the fourth bypass switch 224 are closed, while the fifth bypass switch 225 and the sixth bypass switch 226 are open. Thus, in the first gain mode the first differential LNA stage 202, the second differential LNA stage 203, and the third differential LNA stage 204 are connected in cascade to amplify the differential RF receive signal.

As shown in FIG. 5C, in a second gain mode, the first bypass switch 221, the second bypass switch 222, the third bypass switch 223, and the fourth bypass switch 224 are opened, while the fifth bypass switch 225 and the sixth bypass switch 226 are closed. Thus, in the second gain mode the second LNA 203 is bypassed such that the first differential LNA stage 202 and the third differential LNA stage 204 amplify the differential RF receive signal.

In certain implementations, the LNA 201 further includes a third gain mode in which the second differential amplification stage 203 is bypassed (as in FIG. 5C) and current steering is used in the first differential LNA stage 202 and/or the third differential LNA stage 204.

The LNA 210 provides low noise figure and good output linearity. Moreover, the noise figure and/or output linearity can be maintained substantially constant across at least the first gain mode and the second gain mode, thereby achieving robust performance for multiple gain steps (for example, for high gain and mid gain steps).

In certain embodiments, the LNA 210 is programmable in a particular gain mode via data received over a serial interface or bus.

In certain implementations, either or both of the baluns can be tuned (for instance, using one or more tunable impedances connected thereto) at a particular frequency or frequency range (for instance, millimeter wave frequencies) to reduce loss. Accordingly, any of the baluns herein can be tunable.

Figure 6A:
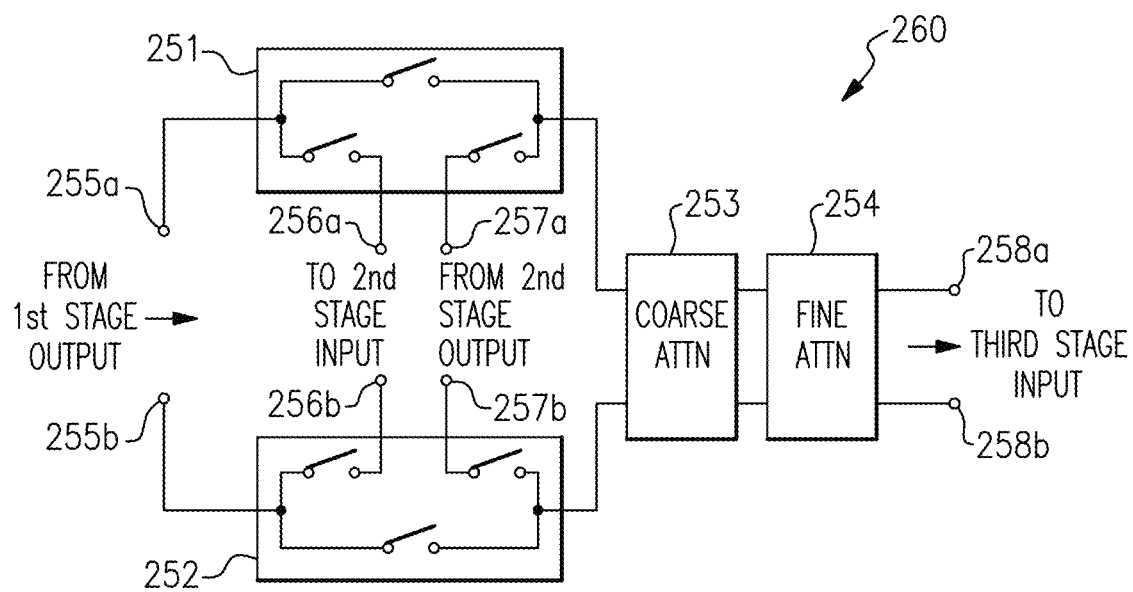
FIG. 6A is a schematic diagram of one embodiment of a gain control switching network for an LNA.

FIG. 6A is a schematic diagram of one embodiment of a gain control switching network 260 for an LNA.

The gain control switching network 260 includes a pair of first stage output terminals 255a/255b for coupling a differential output of a first differential LNA stage, a pair of second stage input terminals 256a/256b for coupling to a differential input of a second differential LNA stage, a pair of second stage output terminals 257a/257b for coupling to a differential output of the second differential LNA stage, and a pair of third stage input terminals for coupling to a differential input of a third differential LNA stage.

As shown in FIG. 6A, the gain control switching network 260 further includes a first bypass switch network 251, a second bypass switch network 252, a coarse attenuator 253, and a fine attenuator 254.

The first bypass switch network 251 and the second bypass switch network 252 collectively serve to bypass the second differential LNA stage based on a selected gain mode. For example, the first bypass switch network 251 can serve the function of the first bypass switch 221, the third bypass switch 223, and the fifth bypass switch 225 of FIGS. 5A-5C, while the second bypass switch network 252 can serve the function of the second bypass switch 222, the fourth bypass switch 224, and the sixth bypass switch 226 of FIGS. 5A-5C.

In the illustrated embodiment, the coarse attenuator 253 and the fine attenuator 254 have been included at the input to the third differential LNA stage. Including one or more attenuators along the amplifier chain of an LNA can provide additional knobs or mechanisms for gain control, thereby expanding the available number of gain steps.

Figure 6B:
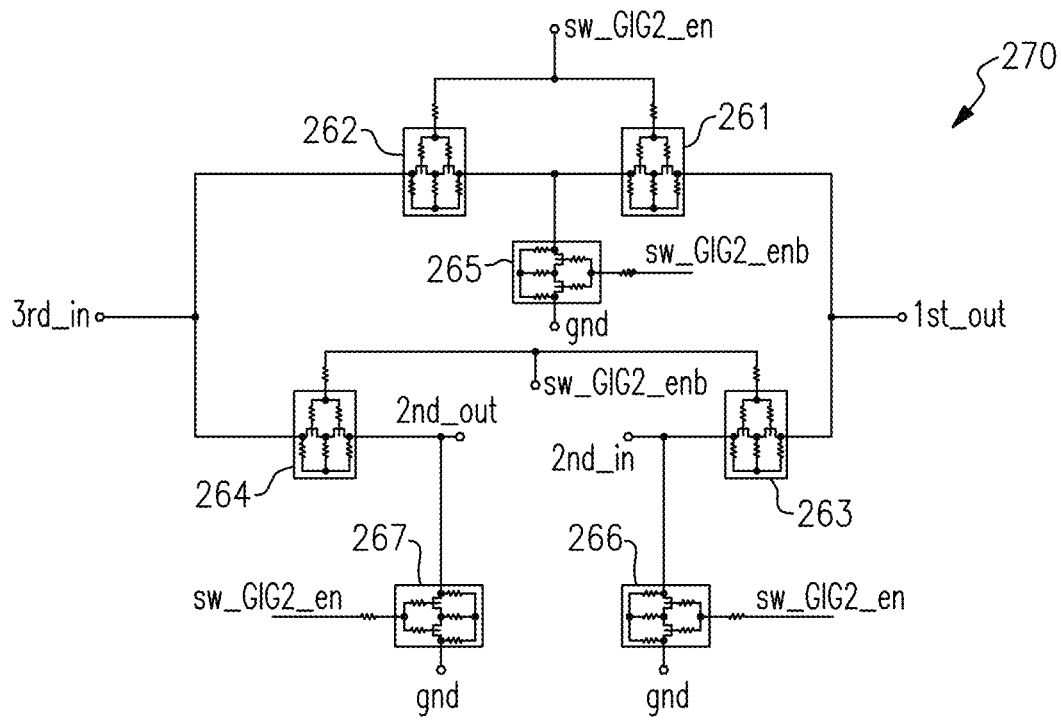
FIG. 6B is a schematic diagram of one embodiment of a bypass switch network for the gain control switching network of FIG. 6A.

FIG. 6B is a schematic diagram of one embodiment of a bypass switch network 270 for the gain control switching network 260 of FIG. 6A. The bypass switch network 270 illustrates one embodiment of a bypass switch network suitable to implement the first bypass switch network 251 or the second bypass switch network 252 of FIG. 6A.

In the illustrated embodiment, the bypass switch network 270 includes a 1st_out terminal for connecting to an output of a first differential LNA stage, a 2nd_in terminal for connecting to an input of a second differential LNA stage, a 2nd_out terminal for connected to an output of the second differential LNA stage, and a 3rd_in terminal for connecting to an input of a third differential LNA stage.

The bypass switch network 270 further includes a first series switch 261 and a second series switch 262 in series along a bypass pass path between the 1st_out terminal and the 3rd_in terminal, a third series switch 263 between the 1st_out terminal and the 2nd_in terminal, a fourth series switch 264 between the 2nd_out terminal and the 3rd_in terminal, a first shunt switch 265 connected between the bypass path (at an intermediate node between the switches 261 and 262) and ground (gnd), a second shunt switch 266 connected between the 2nd_in terminal and ground, and a third shunt switch 267 connected between the 2nd_out terminal and ground. The bypass switch network 270 also includes controls inputs for receiving an enable signal (sw_GIG2_en) and a logically inverted enable signal (sw_GIG2_enb) for opening or closing the switches as depicted.

Figure 6C:
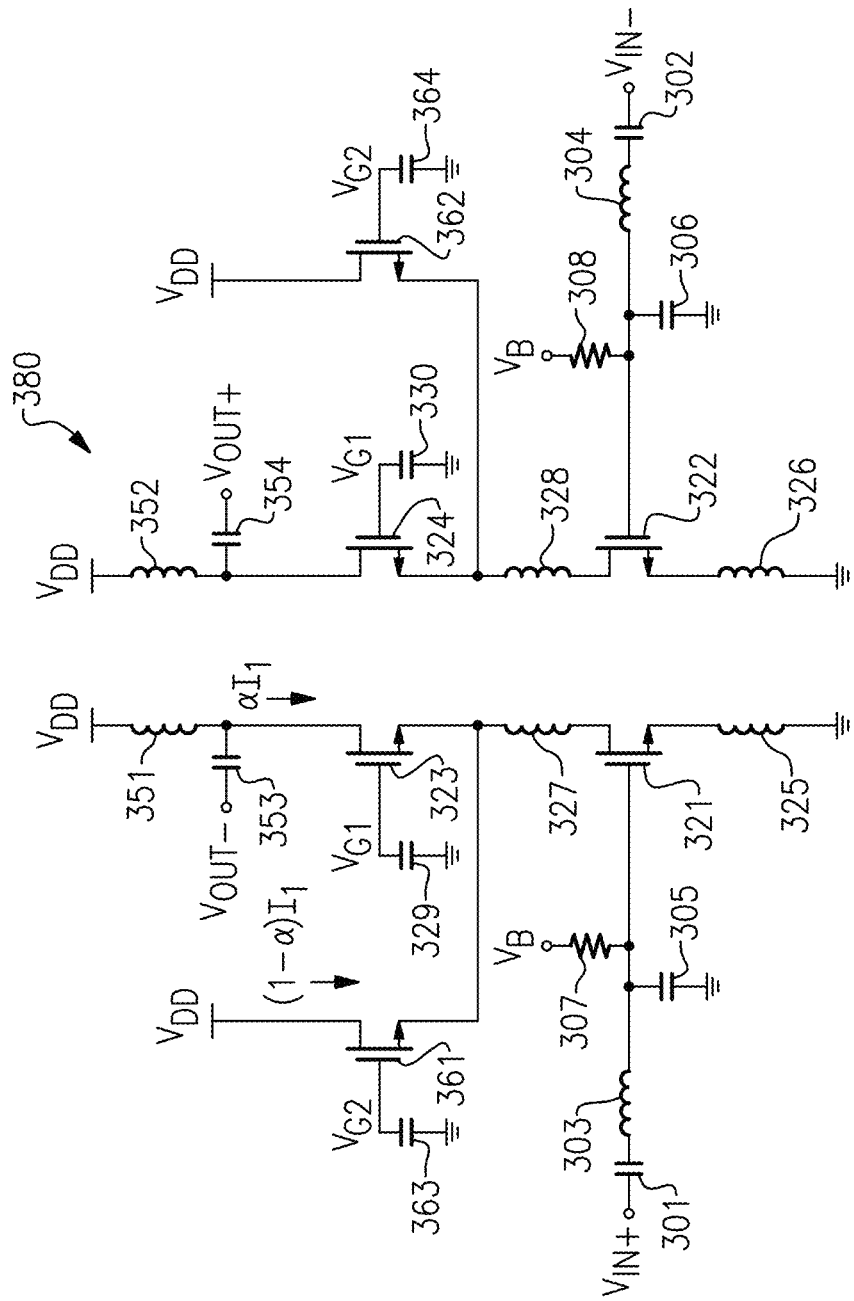
FIG. 6C is a schematic diagram of a LNA stage with gain control according to one embodiment.

As shown in FIG. 6C, each switch is implemented using a series combination of two FETs with associated gate resistors and channeling biasing resistors. Including multiple FETs in series aids in achieving a desired power handling capability.

The bypass switch network 270 of FIG. 6B includes not only series switches to achieve the desired ability to selectively bypass the second differential LNA stage, but also shunt switches used to enhance isolation. In particular, when the bypass path is unselected, the first shunt switch 265 is closed to connect the bypass path to ground and thereby enhance isolation. Additionally, when the second differential LNA stage is being bypassed, the second shunt switch 266 and the third shunt switch 267 are closed to connect the input and the output of the second differential LNA stage to ground.

FIG. 6C is a schematic diagram of a LNA stage 380 with gain control according to one embodiment. The LNA stage 380 illustrates an embodiment of a differential LNA stage that can be used to implement any of the differential LNA stages herein.

The LNA stage 380 includes a non-inverted input terminal $V_{IN+}$ and an inverted input terminal $V_{IN-}$ for receiving a differential RF input signal. The LNA stage 380 further includes a non-inverted output terminal $V_{OUT+}$ and an inverted output terminal $V_{OUT-}$ for providing a differential RF output signal that is amplified relative to the differential RF input signal.

In the illustrated embodiment, the LNA stage 380 includes a first DC blocking input capacitor 301, a second DC blocking input capacitor 302, a first series input inductor 303, a second series input inductor 304, a first shunt input capacitor 305, a second shunt input capacitor 306, a first bias resistor 307 (providing a bias voltage $V_B$), a second bias resistor 308 (providing the bias voltage $V_B$), a first gain n-type field effect transistor (NFET) 321, a second gain NFET 322, a first cascode NFET 323, a second cascode NFET 324, a first source degeneration inductor 325, a second source degeneration inductor 326, a first series inductor 327, a second series inductor 328, a first cascode gate capacitor 329, a second cascode gate capacitor 330, a first load inductor 351, a second load inductor 352, a first DC blocking output capacitor 353, a second DC blocking output capacitor 354, a first current steering NFET 361, a second current steering NFET 362, a first current steering gate capacitor 363, and a second current steering gate capacitor 364.

The LNA stage 380 of FIG. 6C is implemented with current steering to provide gain control. For example, when a current $I_1$ flows through the first gain NFET 321, the gate voltage $V_{G1}$ of the first cascode NFET 323 can be controlled relative to the gate voltage $V_{G2}$ of the current steering NFET 361 (or vice versa and/or the relative transistor widths can be controlled) to control an amount of current $\alpha I_1$ that flows through the first cascode NFET 323 relative to an output of current $(1-\alpha)I_1$ that flows through the current steering NFET 361. Similar steering can be performed on the other half the LNA stage 380.

Accordingly, the LNA stage 380 of FIG. 6C is a differential cascode amplifier stage in which a proportion of the amplifier stage's bias current is steered from the cascode transistors to control gain.

The LNA stage 380 of FIG. 6C illustrates one embodiment of an LNA stage that can be included in the LNAs herein. However, the teachings herein are applicable to LNA circuitry implemented in a wide variety of ways.

The depicted LNA circuitry is implemented using field-effect transistors (FETs), such as silicon-on-insulator (SOI) metal-oxide-semiconductor (MOS) transistors, arranged as cascode amplifier stages. Using cascode stages aids in moderating Miller effects, resulting in improved LNA performance. Moreover, the cascode configuration improves reverse isolation (S12), enhances rejection of common mode input noise, and improves gain since the differential cascode stage offers reduced sensitivity to parasitic ground impedance.

Figure 6D:
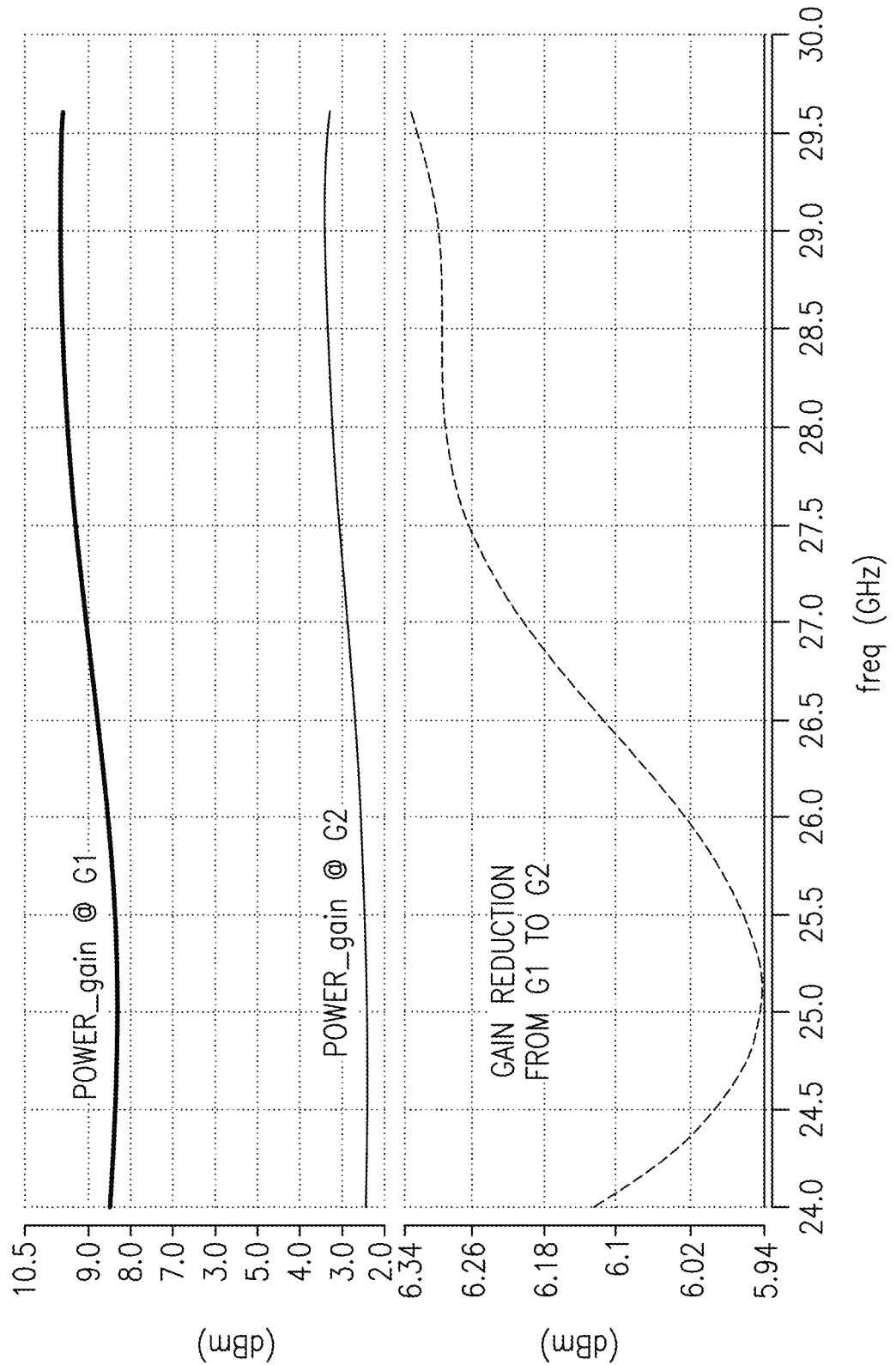
FIG. 6D is one example of a graph of gain versus frequency for an LNA operating in two gain modes.

FIG. 6D is one example of a graph of gain versus frequency for an LNA operating in two gain modes. The graph includes a plot in a mid gain mode (G1) in which a first and a third differential cascode LNA stage provide amplification and no current is steered, and a low gain mode (G2) similar to the mid gain mode G1 except that current steering is also used in accordance with the embodiment of FIG. 6C.

Figure 7A:
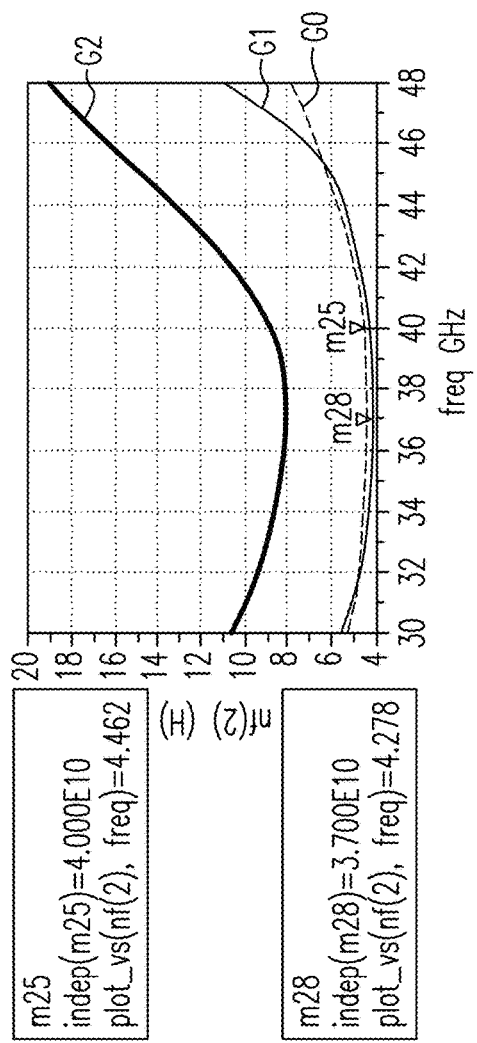
FIG. 7A is one example of a graph of noise figure versus frequency for an LNA operating in three gain modes.

FIG. 7A is one example of a graph of noise figure versus frequency for an LNA operating in three gain modes. The graph includes plots for a high gain mode (G0), mid gain mode (G1), and a low gain mode (G2).

As shown in FIG. 7A, the LNA exhibits low NF of approximately 4-6 dB over frequency from 30 GHz to 44 GHz for the G0 and G1 modes. Moreover, the NF tracks in the G0 and G1 modes. The LNA exhibits higher noise figure in the low gain mode G2, but the higher NF is acceptable due to the large receive signal amplitude when using the low gain mode G2.

Figure 7B:
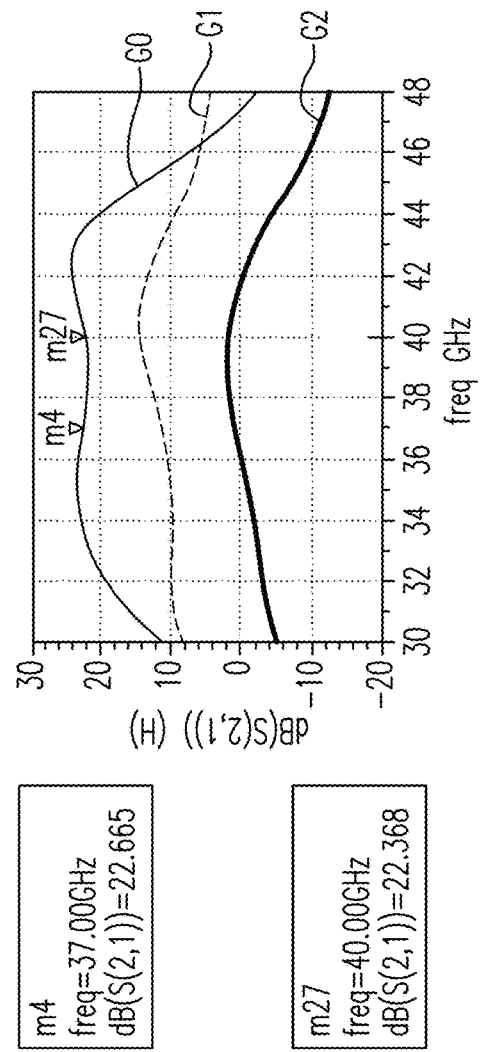
FIG. 7B is one example of a graph of gain versus frequency for an LNA operating in three gain modes.

FIG. 7B is one example of a graph of gain versus frequency for an LNA operating in three gain modes. As shown in FIG. 7B, good gain step is achieved between the G0, G1, and G2 modes.

Although examples of simulation results are depicted, simulation results can vary based on a wide variety of factors, including, but not limited to, simulation parameters, circuit models, simulation tools, circuit topology, and/or a wide variety of other factors.

Figure 8:
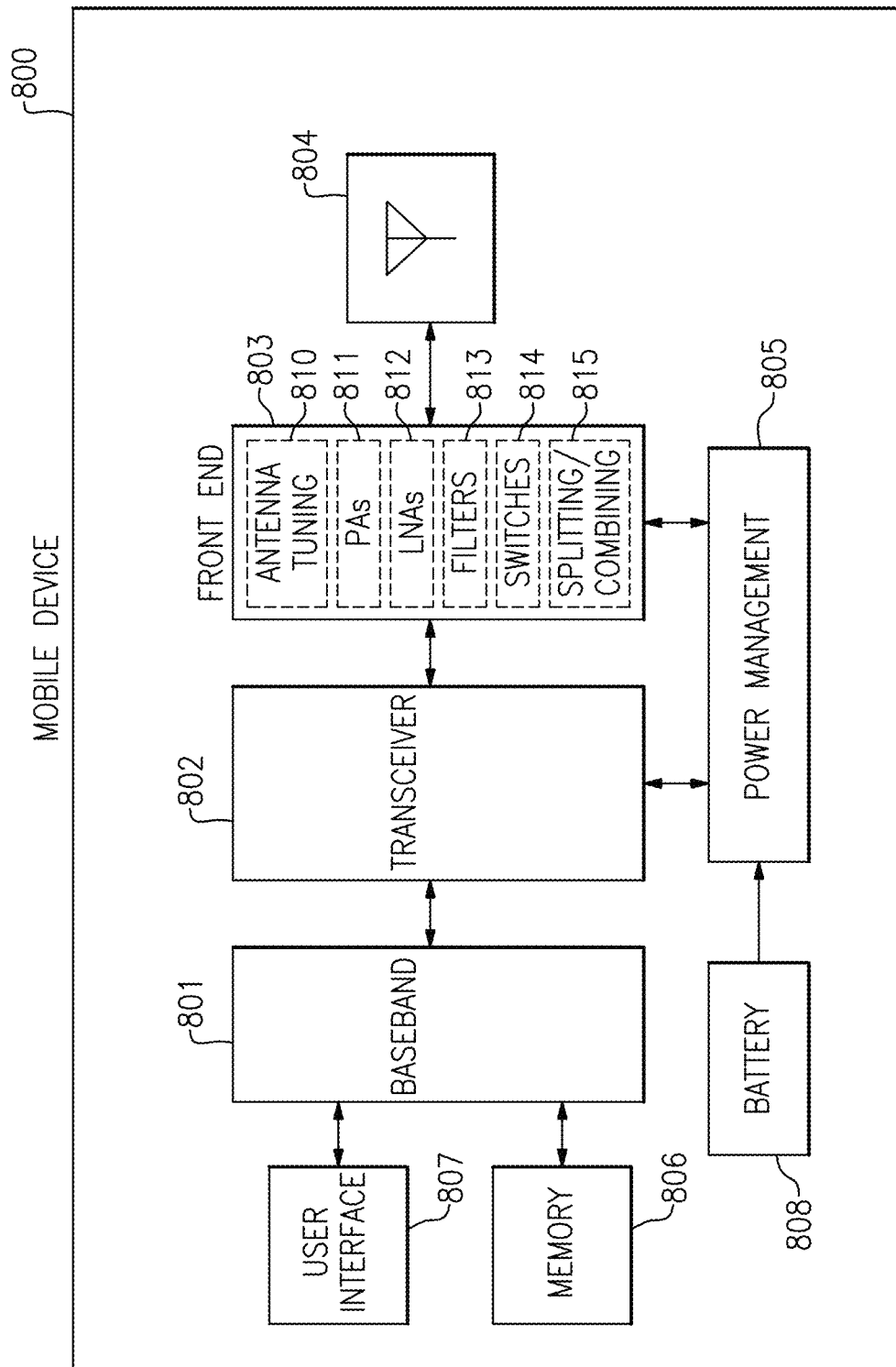
FIG. 8 is a schematic diagram of one embodiment of a mobile device.

FIG. 8 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible. One or more of the LNAs 812 can be implemented in accordance with the present disclosure.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 8, the power management system 805 receives a battery voltage from the battery 808. The battery 808 can be any suitable battery for use in the mobile device 800, including, for example, a lithium-ion battery.

Figure 9A:
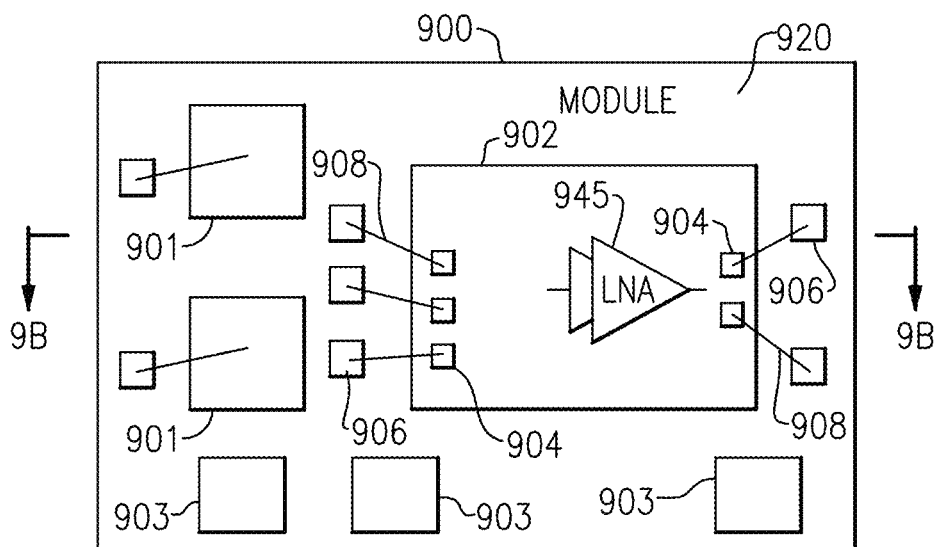
FIG. 9A is a schematic diagram of one embodiment of a packaged module.
Figure 9B:
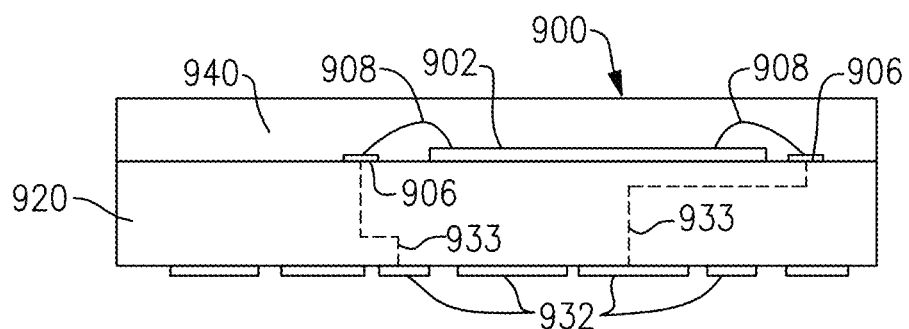
FIG. 9B is a schematic diagram of a cross-section of the packaged module of FIG. 9A taken along the lines 9B-9B.

FIG. 9A is a schematic diagram of one embodiment of a packaged module 900. FIG. 9B is a schematic diagram of a cross-section of the packaged module 900 of FIG. 9A taken along the lines 9B-9B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a low noise amplifier 945, which can be implemented in accordance with one or more features of the present disclosure.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 9B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 9B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

The principles and advantages of the embodiments herein can be used for any other systems or apparatus that have needs for low noise amplification. Examples of such apparatus include RF communication systems. RF communications systems include, but are not limited to, mobile phones, tablets, base stations, network access points, customer-premises equipment (CPE), laptops, and wearable electronics. Thus, the low noise amplifiers herein can be included in various electronic devices, including, but not limited to, consumer electronic products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A low noise amplifier comprising:
a radio frequency input terminal configured to receive a single-ended radio frequency receive signal from an antenna;
an input balun configured to convert the single-ended radio frequency receive signal to a differential radio frequency receive signal; and
an amplifier chain configured to amplify the differential radio frequency receive signal to generate a differential amplified radio frequency receive signal, the amplifier chain including a first differential amplification stage, a second differential amplification stage, and a third differential amplification stage, the amplifier chain operable in a plurality of power modes including a first power mode in which the first differential amplification stage, the second differential amplification stage, and the third differential amplification stage operate in series to amplify the differential radio frequency receive signal, and a second power mode in which the second differential amplification stage is bypassed.

2. The low noise amplifier of claim 1 wherein the low noise amplifier further includes an output balun configured to convert the differential amplified radio frequency receive signal into a single-ended amplified radio frequency receive signal.

3. The low noise amplifier of claim 1 wherein the plurality of power modes further includes a third power mode in which the second differential amplification stage is bypassed and in which a gain of the first differential amplification stage and a gain of the second differential amplification stage is adjusted.

4. The low noise amplifier of claim 3 wherein the first power mode is a high power mode, the second power mode is a mid power mode, and the third power mode is a low power mode.

5. The low noise amplifier of claim 3 wherein the gain of the first differential amplification stage is adjusted in the third power mode by current steering.

6. The low noise amplifier of claim 1 wherein the first differential amplification stage includes a gain transistor, a cascode transistor in series with the gain transistor, and a current steering transistor in parallel with the cascode transistor.

7. The low noise amplifier of claim 6 wherein the gain transistor is biased by a first current, and a proportion of the first current that flows through the cascode transistor relative to the current steering transistor is adjustable to provide gain control.

8. The low noise amplifier of claim 1 wherein the amplifier chain includes a first bypass switch network configured in the first gain mode to connect a first output of the first differential amplification stage to a first input of the second differential amplification stage and to connect a first output of the second differential amplification stage to a first input of the third differential amplification stage, the first bypass switch network further configured in the second gain mode to connect the first output of the first differential amplification stage to the first input of the third differential amplification stage.

9. The low noise amplifier of claim 8 wherein the first bypass switch network includes a first series switch and a second series switch connected between the first output of the first differential amplification stage to the first input of the third differential amplification stage and to one another at an intermediate node, and a first shunt switch connected between the intermediate node and ground.

10. The low noise amplifier of claim 1 wherein the amplifier chain further includes a fine attenuator and a coarse attenuator coupled to a differential input to the third differential amplification stage.

11. A mobile device comprising:
an antenna; and
a front-end system including a low noise amplifier having an input terminal configured to receive a single-ended radio frequency receive signal from the antenna, the low noise amplifier including an input balun configured to convert the single-ended radio frequency receive signal to a differential radio frequency receive signal, and an amplifier chain configured to amplify the differential radio frequency receive signal to generate a differential amplified radio frequency receive signal, the amplifier chain including a first differential amplification stage, a second differential amplification stage, and a third differential amplification stage, the low noise amplifier operable in a plurality of power modes including a first power mode in which the first differential amplification stage, the second differential amplification stage, and the third differential amplification stage operate in series to amplify the differential radio frequency receive signal, and a second power mode in which the second differential amplification stage is bypassed.

12. The mobile device of claim 11 wherein the low noise amplifier further includes an output balun configured to convert the differential amplified radio frequency receive signal into a single-ended amplified radio frequency receive signal.

13. The mobile device of claim 11 wherein the plurality of power modes further includes a third power mode in which the second differential amplification stage is bypassed and in which a gain of the first differential amplification stage and a gain of the second differential amplification stage is adjusted.

14. The mobile device of claim 13 wherein the gain of the first differential amplification stage is adjusted in the third power mode by current steering.

15. The mobile device of claim 11 wherein the first differential amplification stage includes a gain transistor, a cascode transistor in series with the gain transistor, and a current steering transistor in parallel with the cascode transistor.

16. The mobile device of claim 15 wherein the gain transistor is biased by a first current, and a proportion of the first current that flows through the cascode transistor relative to the current steering transistor is adjustable to provide gain control.

17. The mobile device of claim 11 wherein the amplifier chain includes a first bypass switch network configured in the first gain mode to connect a first output of the first differential amplification stage to a first input of the second differential amplification stage and to connect a first output of the second differential amplification stage to a first input of the third differential amplification stage, the first bypass switch network further configured in the second gain mode to connect the first output of the first differential amplification stage to the first input of the third differential amplification stage.

18. The mobile device of claim 17 wherein the first bypass switch network includes a first series switch and a second series switch connected between the first output of the first differential amplification stage to the first input of the third differential amplification stage and to one another at an intermediate node, and a first shunt switch connected between the intermediate node and ground.

19. The mobile device of claim 11 wherein the amplifier chain further includes a fine attenuator and a coarse attenuator coupled to a differential input to the third differential amplification stage.

20. A method of low noise amplification, the method comprising:
- converting a single-ended radio frequency receive signal to a differential radio frequency receive signal using an input balun of a low noise amplifier;
- amplifying the differential radio frequency receive signal to generate a differential amplified radio frequency receive signal using an amplifier chain of a low noise amplifier;
- operating the amplifier chain in a first gain mode in which a first differential amplification stage, a second differential amplification stage, and a third differential amplification stage of the amplifier chain operate in series with one another to amplify the differential radio frequency receive signal; and
- operating the amplifier chain in a second gain mode in which the second differential amplification stage is bypassed.

* * * * *